(12) United States Patent
Liao

(10) Patent No.: US 10,121,489 B1
(45) Date of Patent: Nov. 6, 2018

(54) METHOD, DEVICE, AND NON-TRANSITORY COMPUTER READABLE STORAGE MEDIUM FOR PROCESSING AUDIO SIGNAL

(71) Applicant: HTC Corporation, Taoyuan (TW)

(72) Inventor: Chun-Min Liao, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 15/655,913

(22) Filed: Jul. 21, 2017

(51) Int. Cl.
*G10L 21/0208* (2013.01)
*H03G 3/30* (2006.01)
*G10L 21/0272* (2013.01)
*G10L 21/034* (2013.01)
*G10L 21/0332* (2013.01)

(52) U.S. Cl.
CPC ...... *G10L 21/0208* (2013.01); *G10L 21/0272* (2013.01); *G10L 21/034* (2013.01); *G10L 21/0332* (2013.01); *H03G 3/3005* (2013.01); *G10L 2021/02087* (2013.01)

(58) Field of Classification Search
CPC ............. G10L 21/0208; G10L 21/0272; G10L 21/0332; G10L 21/034; G10L 2021/02087; H03G 3/3005
USPC ................................................ 381/71.1, 94.1
See application file for complete search history.

(56) References Cited

U.S. PATENT DOCUMENTS

| 4,630,302 | A | * | 12/1986 | Kryter | ....................... | H03G 3/32 |
| | | | | | | 381/106 |
| 2012/0008796 | A1 | * | 1/2012 | Furge | ......................... | H03F 1/32 |
| | | | | | | 381/94.1 |
| 2014/0010380 | A1 | * | 1/2014 | Usher | ................... | H03G 3/3005 |
| | | | | | | 381/58 |
| 2016/0173995 | A1 | * | 6/2016 | Reams | .................. | G10L 19/028 |
| | | | | | | 381/107 |

* cited by examiner

*Primary Examiner* — William A Jerez Lora
(74) *Attorney, Agent, or Firm* — CKC & Partners Co., Ltd.

(57) ABSTRACT

A processing method includes acquiring an audio signal, magnifying one or more first portions of the audio signal in response to one or more magnitudes of the one or more first portions of the audio signal are lower than a predetermined threshold, deforming one or more second portions of the audio signal in response to one or more magnitudes of the one or more second portions of the audio signal are greater than the predetermined threshold, and performing a noise reduction to the one or more deformed second portions of the audio signal to reduce the one or more deformed second portions of the audio signal.

17 Claims, 5 Drawing Sheets

METHOD, DEVICE, AND NON-TRANSITORY COMPUTER READABLE STORAGE MEDIUM FOR PROCESSING AUDIO SIGNAL

BACKGROUND

Technical Field

The present disclosure relates to a device, a method, and a non-transitory computer readable storage medium. More particularly, the present disclosure relates to an electronic device, a method, and a non-transitory computer readable storage medium for processing an audio signal.

Description of Related Art

With advances in technology, electronic devices, such as smart phones, tablet computers, and VR headsets, are being increasingly used.

An electronic device may use one microphone to receive a user' voice and an attendee's voice. However, since the user' voice and the attendee's voice are mixed, it is difficult to process one of the user' voice and the attendee's voice without affecting another one.

SUMMARY

One aspect of the present disclosure is related to a method. In accordance with one embodiment of the present disclosure, the method includes acquiring an audio signal, magnifying one or more first portions of the audio signal in response to one or more magnitudes of the one or more first portions of the audio signal are lower than a predetermined threshold, deforming one or more second portions of the audio signal in response to one or more magnitudes of the one or more second portions of the audio signal are greater than the predetermined threshold, and performing a noise reduction to the one or more deformed second portions of the audio signal to reduce the one or more deformed second portions of the audio signal.

In accordance with one embodiment of the present disclosure, the operation of deforming the one or more second portions of the audio signal includes performing a modulo operation to the one or more second portions of the audio signal.

In accordance with one embodiment of the present disclosure, the operation of deforming the one or more second portions of the audio signal includes magnifying the one or more second portions of the audio signal, and performing a modulo operation to the one or more magnified second portions of the audio signal.

In accordance with one embodiment of the present disclosure, a gain of magnifying the one or more second portions of the audio signal is identical to a gain of magnifying the one or more first portions of the audio signal.

In accordance with one embodiment of the present disclosure, a divisor of the modulo operation is equal to a product of the predetermined threshold and a gain of magnifying the one or more second portions of the audio signal.

In accordance with one embodiment of the present disclosure, the operations of magnifying the one or more first portions of the audio signal and deforming the one or more second portions of the audio signal are performed by using identical mathematical function.

In accordance with one embodiment of the present disclosure, the method further includes performing an auto gain control to the audio signal to normalize the audio signal.

Another aspect of the present disclosure is related to an electronic device. In accordance with one embodiment of the present disclosure, the electronic device includes one or more processing components, memory, and one or more programs. The memory is electrically connected to the one or more processing components. The one or more programs are stored in the memory and configured to be executed by the one or more processing components. The one or more programs include instructions for acquiring an audio signal, magnifying one or more first portions of the audio signal in response to one or more magnitudes of the one or more first portions of the audio signal are lower than a predetermined threshold, deforming one or more second portions of the audio signal in response to one or more magnitudes of the one or more second portions of the audio signal are greater than the predetermined threshold, and performing a noise reduction to the one or more deformed second portions of the audio signal to reduce the one or more deformed second portions of the audio signal.

In accordance with one embodiment of the present disclosure, the one or more programs further includes instructions for performing a modulo operation to the one or more second portions of the audio signal.

In accordance with one embodiment of the present disclosure, the one or more programs further includes instructions for magnifying the one or more second portions of the audio signal, and performing a modulo operation to the one or more magnified second portions of the audio signal.

In accordance with one embodiment of the present disclosure, a gain of magnifying the one or more second portions of the audio signal is identical to a gain of magnifying the one or more first portions of the audio signal.

In accordance with one embodiment of the present disclosure, a divisor of the modulo operation is equal to a product of the predetermined threshold and a gain of magnifying the one or more second portions of the audio signal.

In accordance with one embodiment of the present disclosure, the operations of magnifying the one or more first portions of the audio signal and deforming the one or more second portions of the audio signal are performed by using identical mathematical function.

In accordance with one embodiment of the present disclosure, the one or more programs further include instructions for performing an auto gain control to the audio signal to normalize the audio signal.

Another aspect of the present disclosure is related to a non-transitory computer readable storage medium. In accordance with one embodiment of the present disclosure, the non-transitory computer readable storage medium storing one or more programs includes instructions, which when executed, causes one or more processing components to perform operations including acquiring an audio signal, magnifying one or more first portions of the audio signal in response to one or more magnitudes of the one or more first portions of the audio signal are lower than a predetermined threshold, deforming one or more second portions of the audio signal in response to one or more magnitudes of the one or more second portions of the audio signal are greater than the predetermined threshold, and performing a noise reduction to the one or more deformed second portions of the audio signal to reduce the one or more deformed second portions of the audio signal.

In accordance with one embodiment of the present disclosure, the non-transitory computer readable storage medium including instructions, which when executed, causes one or more processing components to further perform operations including performing a modulo operation to the one or more second portions of the audio signal.

In accordance with one embodiment of the present disclosure, the non-transitory computer readable storage medium including instructions, which when executed, causes one or more processing components to further perform operations including magnifying the one or more second portions of the audio signal, and performing a modulo operation to the one or more magnified second portions of the audio signal.

In accordance with one embodiment of the present disclosure, a gain of magnifying the one or more second portions of the audio signal is identical to a gain of magnifying the one or more first portions of the audio signal.

In accordance with one embodiment of the present disclosure, a divisor of the modulo operation is equal to a product of the predetermined threshold and a gain of magnifying the one or more second portions of the audio signal.

In accordance with one embodiment of the present disclosure, the operations of magnifying the one or more first portions of the audio signal and deforming the one or more second portions of the audio signal are performed by using identical mathematical function.

Through the operations of one embodiment described above, a portion of the audio signal corresponding to the user's voice can be reduced.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
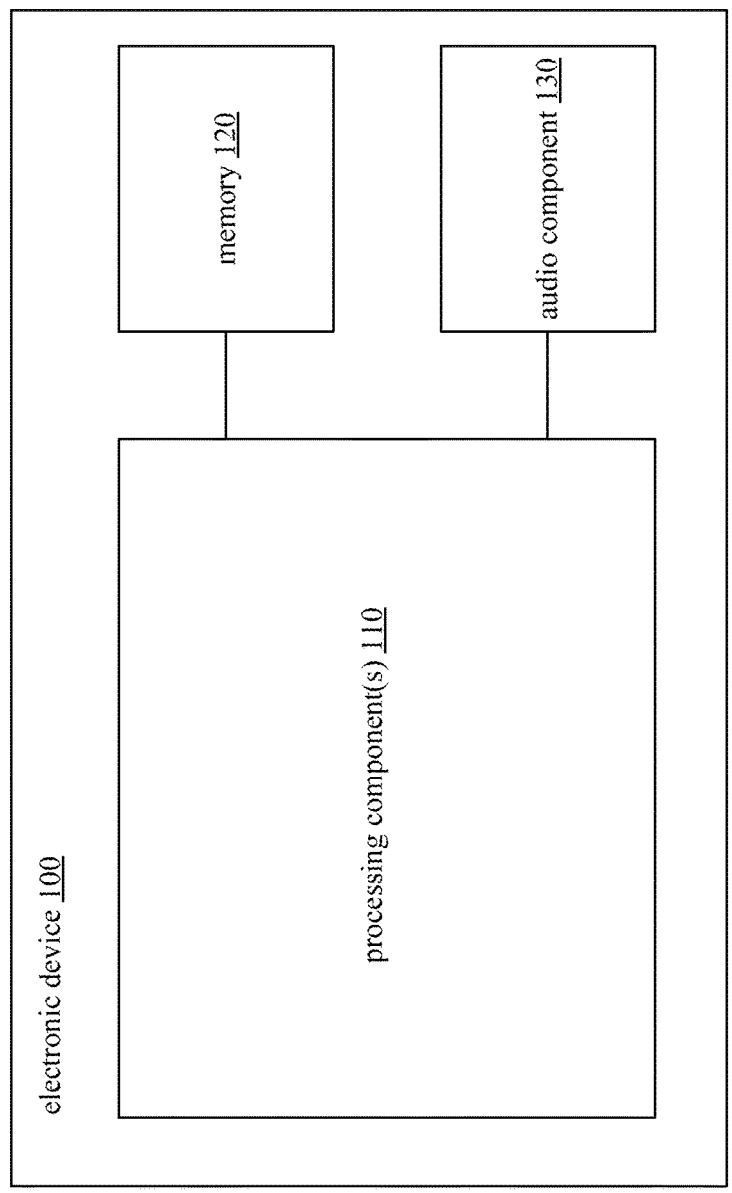
FIG. 1 is a schematic block diagram of an electronic device in accordance with one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that, in the description herein and throughout the claims that follow, when an element is referred to as being "electrically connected" or "electrically coupled" to another element, it can be directly connected or coupled to the other element or intervening elements may be present. In contrast, when an element is referred to as being "directly connected" or "directly coupled" to another element, there are no intervening elements present. Moreover, "electrically connect" or "connect" can further refer to the interoperation or interaction between two or more elements.

It will be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It will be understood that, in the description herein and throughout the claims that follow, the terms "comprise" or "comprising," "include" or "including," "have" or "having," "contain" or "containing" and the like used herein are to be understood to be open-ended, i.e., to mean including but not limited to.

It will be understood that, in the description herein and throughout the claims that follow, the phrase "and/or" includes any and all combinations of one or more of the associated listed items.

It will be understood that, in the description herein and throughout the claims that follow, words indicating direction used in the description of the following embodiments, such as "above," "below," "left," "right," "front" and "back," are directions as they relate to the accompanying drawings. Therefore, such words indicating direction are used for illustration and do not limit the present disclosure.

It will be understood that, in the description herein and throughout the claims that follow, the terms "around," "about," "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around," "about," "approximately" or "substantially" can be inferred if not expressly stated, or meaning other approximate values.

It will be understood that, in the description herein and throughout the claims that follow, the meaning of "a," "an," and "the" includes reference to the plural unless the context clearly dictates otherwise.

It will be understood that, in the description herein and throughout the claims that follow, unless otherwise defined, all terms (including technical and scientific terms) have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any element in a claim that does not explicitly state "means for" performing a specified function, or "step for" performing a specific function, is not to be interpreted as a "means" or "step" clause as specified in 35 U.S.C. § 112(f). In particular, the use of "step of" in the claims herein is not intended to invoke the provisions of 35 U.S.C. § 112(f).

FIG. 1 is a schematic block diagram of an electronic device 100 in accordance with one embodiment of the present disclosure. In this embodiment, the electronic device 100 includes one or more processing components 110, a memory 120, and an audio component 130. In this embodiment, the processing component 110 is electrically connected to the memory 120 and the audio component 130. In one embodiment, the processing component 110, the memory 120, and the audio component 130 may be disposed separately in different devices. For example, the processing component 110 and the memory 120 may be disposed in a computer device, and the audio component 130 may be disposed at a headset device. In one embodiment, the processing component 110 may further include a speaker (not shown), but the present disclosure is not limited in this regard.

In one embodiment, the one or more processing components 110 can be realized by, for example, one or more processors, such as central processors and/or microprocessors, but are not limited in this regard. In one embodiment, the memory 120 includes one or more memory devices, each of which comprises, or a plurality of which collectively comprise a computer readable storage medium. The memory 120 may include a read-only memory (ROM), a flash memory, a floppy disk, a hard disk, an optical disc, a flash disk, a flash drive, a tape, a database accessible from a network, or any storage medium with the same functionality that can be contemplated by persons of ordinary skill in the art to which this invention pertains. In one embodiment, the audio component 130 can be realized by, for example, a microphone or a headset microphone.

In one embodiment, the one or more processing components 110 may run or execute various software programs and/or sets of instructions stored in the memory 120 to perform various functions for the electronic device 100 and to process data.

It should be noted that the ways in which the devices and components in the electronic device 100 realized are not limited by the embodiments described above. In addition, the connections among these devices and components are not limited by the embodiments described above. Any configuration of these devices and components and interconnections there among that would enable the electronic device 100 to practice the technical features described below and/or in the claims can be used herein.

In one embodiment, the audio component 130 may receive a voice. In one embodiment, the audio component 130 may generate an audio signal ADS according to the voice. In one embodiment, the audio signal ADS may be a voltage signal, a current signal, or another suitable signal.

In one embodiment, the voice includes a user's voice and an attendee's voice. In one embodiment, under a condition that the distance between the audio component 130 and the user is shorter than the distance between the audio component 130 and the attendee, the volume of the user's voice received by the audio component 130 is greater than the volume of the attendee's voice received by the audio component 130. In one embodiment, one or more magnitudes of one or more second portions of the audio signal ADS corresponding to the user's voice are greater than one or more magnitudes of one or more first portions of the audio signal ADS corresponding to the attendee's voice.

In one embodiment, the audio component 130 provides the audio signal ADS to the one or more processing components 110. In one embodiment, the one or more processing components 110 receive the audio signal ADS and determine whether a magnitude of any portion of the audio signal ADS is lower than or greater than a predetermined threshold. In one embodiment, the predetermined threshold can be determined on a basis of actual requirements.

In one embodiment, the one or more processing components 110 magnify one or more first portions of the audio signal ADS with a gain in response to one or more magnitudes of the one or more first portions of the audio signal ADS are lower than the predetermined threshold. In one embodiment, the gain for magnifying the one or more first portions of the audio signal ADS can be determined on a basis of actual requirements.

In one embodiment, the one or more processing components 110 deform one or more second portions of the audio signal ADS in response to one or more magnitudes of the one or more second portions of the audio signal ADS are greater than the predetermined threshold. In one embodiment, the one or more second portions of the audio signal ADS are substantially deformed into noise.

In one embodiment, the one or more processing components 110 perform a noise reduction to the audio signal ADS to reduce the one or more deformed second portions of the audio signal ADS. In one embodiment, the one or more deformed second portions of the audio signal ADS are substantially removed (e.g., substantially filter out) by the noise reduction or the moving average.

Figures 2A, 2B:
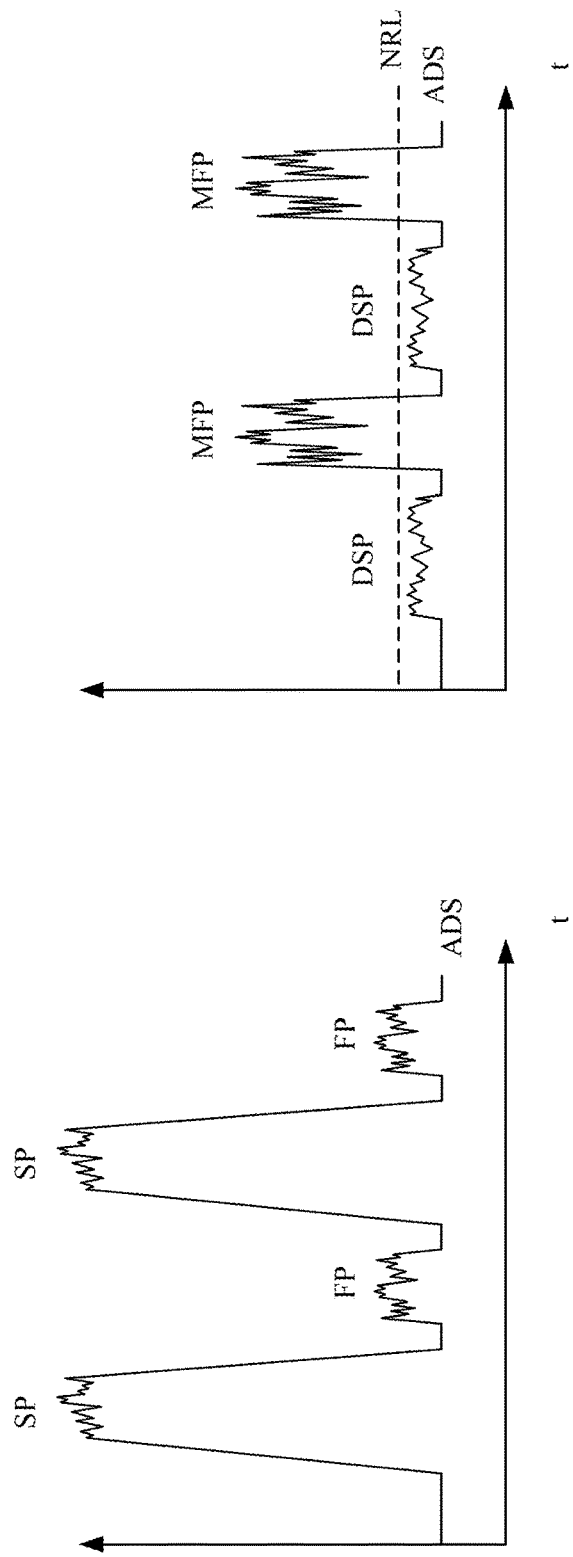
FIGS. 2A-2C illustrate an illustrative example of operations of the electronic device in accordance with one embodiment of the present disclosure.
Figure 2C:
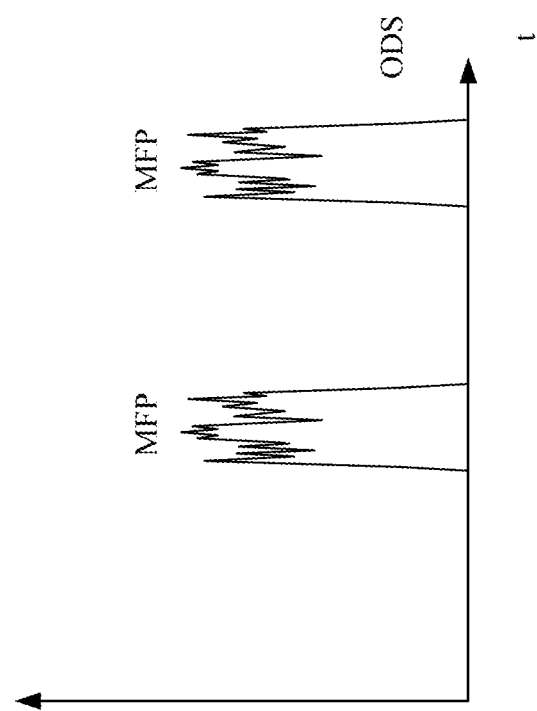

For example, referring to FIGS. 2A-2C, in this example, the first portions FP of the audio signal ADS correspond to the attendee's voice and the second portions SP of the audio signal ADS correspond to the user's voice. In this example, since the magnitudes of the first portions FP of the audio signal ADS are lower than the predetermined threshold, the one or more processing components 110 magnify the first portions FP of the audio signal ADS. In this example, since the magnitudes of the second portions SP of the audio signal ADS are greater than the predetermined threshold, the one or more processing components 110 deform the second portions SP of the audio signal ADS.

Subsequently, the one or more processing components 110 perform a noise reduction to the processed audio signal ADS with the magnified first portions MFP and the deformed second portions DSP, to filter out noise with a magnitude lower a cutoff threshold NRL, to generate an output audio signal OPS. Since the magnitudes of the portions DSP of the processed audio signal ADS are lower than the cutoff threshold NRL, the deformed second portions DSP of the processed audio signal ADS are removed in the noise reduction.

After the output audio signal OPS is generated, the one or more processing components 110 output the output audio signal OPS, so that the speaker may give an audio output corresponding to the output audio signal OPS.

Through the operations described above, portions of the audio signal ADS corresponding to the user's voice can be reduced. In such a configuration, when the user wears a headset device, the user can hear the magnified attendee's voice received by the audio component 130 (e.g., microphone) without hearing his/her own voice received by the audio component 130, so that discomfort causing by hearing one's own voice from the headset device can be avoided.

In one embodiment of the present disclosure, the one or more processing components 110 may deform the one or more second portions of the audio signal ADS by performing a modulo operation to the one or more second portions of the audio signal ADS. In one embodiment, the one or more processing components 110 may modulo the one or more second portions of the audio signal ADS by a divisor. In one embodiment, the divisor can be determined on a basis of actual requirements.

In one embodiment of the present disclosure, the one or more processing components 110 may deform the one or more second portions of the audio signal ADS by magnifying the one or more second portions of the audio signal ADS with a gain and performing a modulo operation to the one or more magnified second portions of the audio signal ADS. In one embodiment, a gain of magnifying the one or more second portions of the audio signal ADS is identical to the gain of magnifying the one or more first portions of the audio signal ADS, but the present disclosure is not limited in this regard. In one embodiment, the one or more processing components 110 may modulo the one or more second portions of the audio signal ADS by a divisor. In one embodiment, the divisor is equal to a product of the predetermined threshold and the gain for magnifying the one or more second portions of the audio signal.

In one embodiment of the present disclosure, the one or more processing components 110 may magnify the one or more first portions of the audio signal ADS and deform the one or more second portions of the audio signal ADS by using identical mathematical function (e.g., referred as to deformation function in the description below). In one embodiment, the one or more processing components 110 may magnify the one or more first portions and the one or more second portions of the audio signal ADS with identical gain and modulo the one or more magnified first portions and the one or more magnified second portions of the audio signal ADS by identical divisor. In this embodiment, the predetermined threshold described above is equal to the divisor divided by the gain.

For example, in one embodiment, the deformation function may be f(t)=x(t)*g mod d, in which f(t) indicates the magnitude of the processed audio signal ADS, x(t) indicates the magnitude of the audio signal ADS, t indicates time, g indicate the gain, and d indicate the divisor. That is, by applying this deformation function to the audio signal ADS, the one or more processing components 110 magnify the magnitude x(t) of the audio signal ADS by the gain g, and modulo the magnitude of the magnified audio signal ADS (i.e., x(t)*g) by the divisor d, so as to generate the magnitude of the processed audio signal ADS with the one or more magnified first portions and the one or more deformed second portions. In this embodiment, the predetermined threshold described above can be presented by d/g.

It should be noted that the deformation function described above is for illustrative purposes, and other mathematical functions are within the contemplated scope of the present application.

Figure 3:
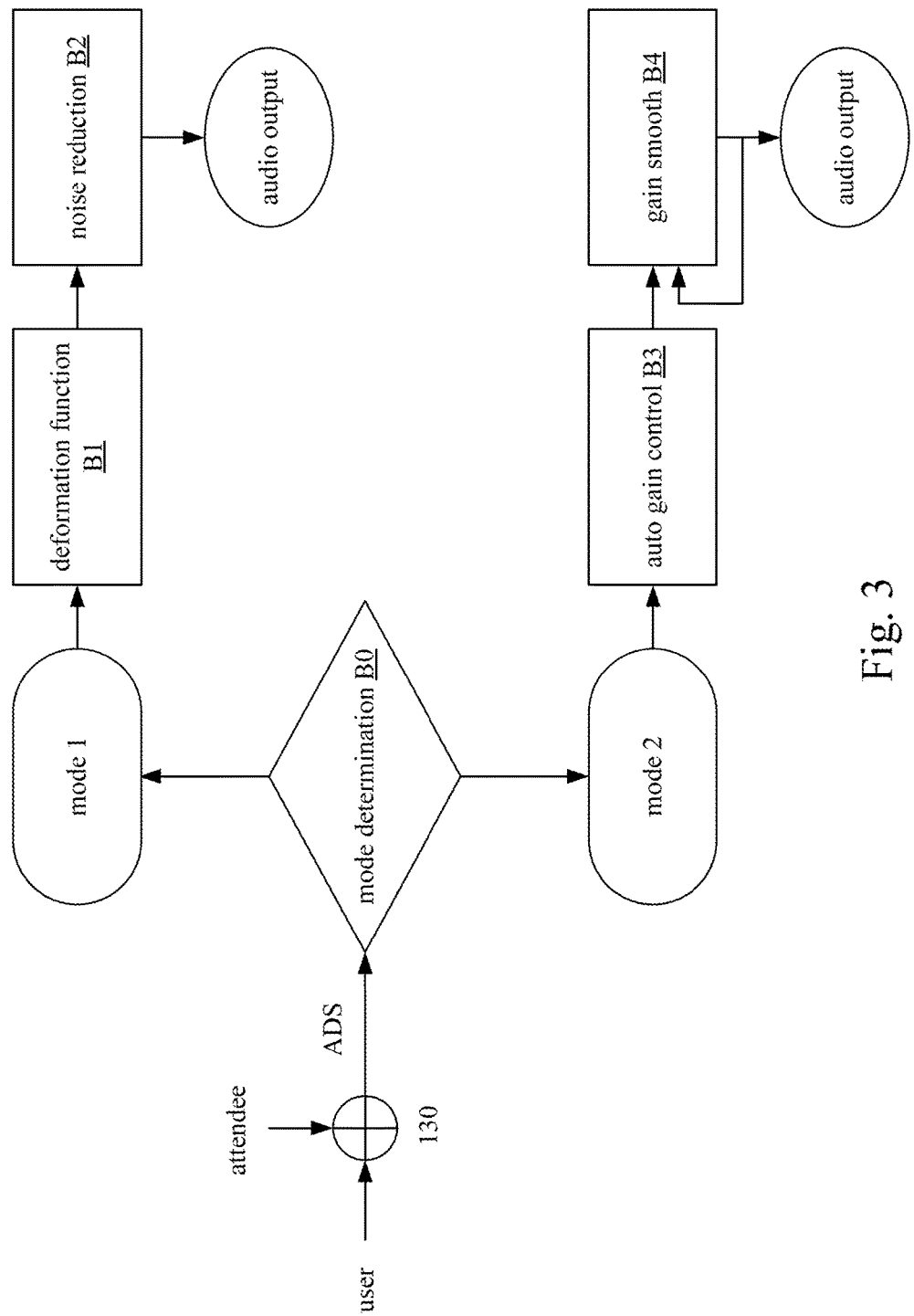
FIG. 3 illustrates an illustrative example of operations of the electronic device in accordance with another embodiment of the present disclosure.

Referring to FIG. 3, in one embodiment of the present disclosure, the one or more processing components 110 may determine to reduce one or more portions of the audio signal ADS or to normalize the audio signal ADS according to a mode selection.

In this embodiment, the audio component 130 can receive a voice mixed with a user's voice and an attendee's voice. The audio component 130 generate the audio signal ADS according to the voice and provide the audio signal ADS to the one or more processing components 110.

In operation B0, the one or more processing components 110 determine which one of mode 1 and mode 2 is selected to process the audio signal ADS. If mode 1 is selected, the one or more processing components 110 execute operations B1, B2 to reduce one or more second portions of the audio signal ADS corresponding to the user's voice and retain and magnify one or more first portions of the audio signal ADS corresponding to the attendee's voice. If mode 2 is selected, the one or more processing components 110 execute operations B3, B4 to retain the one or more first portions of the audio signal ADS corresponding to the user's voice and the one or more second portions of the audio signal ADS corresponding to the attendee's voice and reduce the difference between the magnitudes corresponding to the user's voice and the attendee's voice.

In operation B1, the one or more processing components 110 apply the deformation function described above to the audio signal ADS, to magnify the one or more first portions of the audio signal ADS and deform the one or more second portions of the audio signal ADS. Details in this regard can be ascertained with reference to the paragraphs described above.

In operation B2, the one or more processing components 110 perform a noise reduction to the processed audio signal ADS to reduce or remove the one or more deformed second portions of the audio signal ADS, to generate the output audio signal OPS. Details in this regard can be ascertained with reference to the paragraphs described above.

After the output audio signal OPS is generated, the one or more processing components 110 output the output audio signal OPS, so that a speaker may give an audio output corresponding to the output audio signal OPS.

In operation B3, the one or more processing components 110 perform an auto gain control to the audio signal ADS to normalize the one or more first portions and the one or more second portions of the audio signal ADS. In one embodiment, the one or more processing components 110 may normalize the audio signal ADS by continuously adjust a gain applied to different portions the audio signal ADS. For example, the one or more processing components 110 may apply the gain with a first value to magnify the one or more first portions and apply the gain with a second value lower than the first value to reduce the one or more second portions. In an alternative embodiment, the one or more processing components 110 perform the auto gain control by using a hardware auto gain controller.

In operation B4, the one or more processing components 110 perform a gain smooth function to smooth the gain variation in the auto gain control. In one embodiment, the gain smooth function may be performed corresponding to a normalized output audio signal NPS in previous period. In one embodiment, this operation can be omitted.

After the audio signal ADS is normalized by the operations B3, B4, the one or more processing components 110 output the normalized output audio signal NPS, so that a speaker may give a voice corresponding to the normalized output audio signal NPS.

Through the operations described above, the user can select mode 1 to reduce the one or more first portions of the audio signal ADS corresponding to the user's voice, or select mode 2 to reduce the differences among the one or more portions of the audio signal ADS and the one or more portions of the audio signal ADS on a basis of actual requirements.

Details of the present disclosure are described in the paragraphs below with reference to a processing method in FIG. 4. However, the present disclosure is not limited to the embodiment below.

It should be noted that the processing method can be applied to an electronic device having a structure that is the same as or similar to the structure of the electronic device 100 shown in FIG. 1. To simplify the description below, the embodiment shown in FIG. 1 will be used as an example to describe the processing method according to an embodiment of the present disclosure. However, the present disclosure is not limited to application to the embodiment shown in FIG. 1.

It should be noted that, in some embodiments, the processing method may be implemented as a computer program. When the computer program is executed by a computer, an electronic device, or the one or more processing components 110 in FIG. 1, this executing device performs the processing method. The computer program can be stored in a non-transitory computer readable medium such as a ROM (read-only memory), a flash memory, a floppy disk, a hard disk, an optical disc, a flash disk, a flash drive, a tape, a database accessible from a network, or any storage medium with the same functionality that can be contemplated by persons of ordinary skill in the art to which this invention pertains.

In addition, it should be noted that in the operations of the following processing method, no particular sequence is required unless otherwise specified. Moreover, the following operations also may be performed simultaneously or the execution times thereof may at least partially overlap.

Furthermore, the operations of the following processing method may be added to, replaced, and/or eliminated as appropriate, in accordance with various embodiments of the present disclosure.

Figure 4:
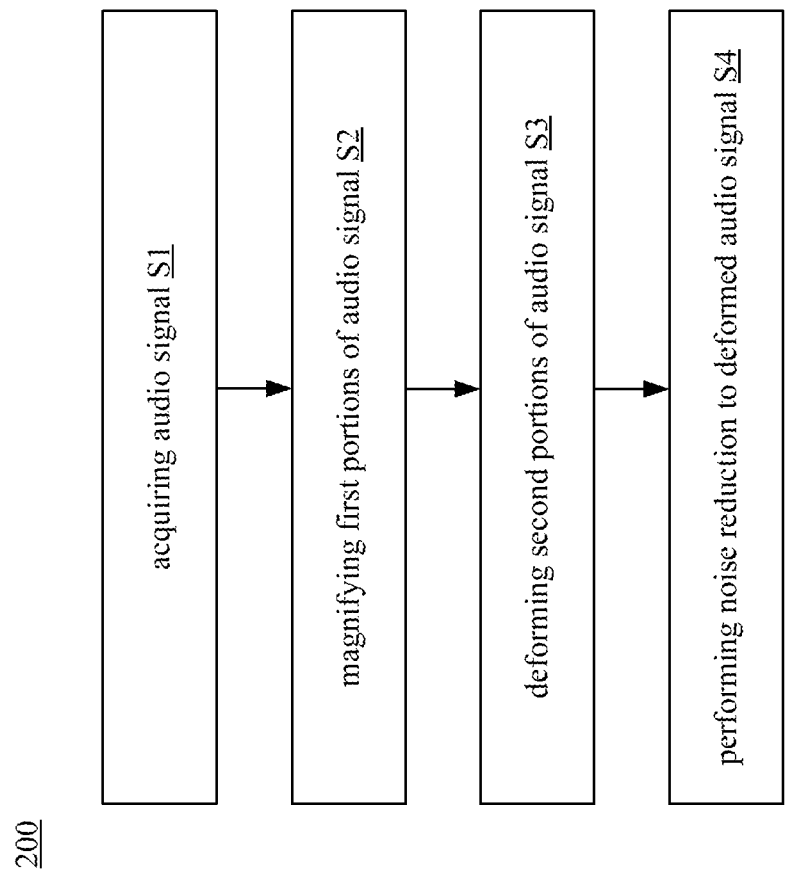
FIG. 4 is a flowchart of a processing method in accordance with one embodiment of the present disclosure.

Reference is made to FIGS. 1 and 4. The processing method 200 includes the operations below.

In operation S1, the one or more processing components 110 acquire an audio signal ADS via the audio component 130. In one embodiment, the audio signal ADS corresponds to a voice including a user's voice and an attendee's voice. Details of the audio signal ADS can be ascertained with reference to the paragraphs above, and a description in this regard will not be repeated herein.

In operation S2, the one or more processing components 110 magnify one or more first portions of the audio signal ADS in response to one or more magnitudes of the one or more first portions of the audio signal ADS are lower than a predetermined threshold.

In operation S3, the one or more processing components 110 deform one or more second portions of the audio signal ADS in response to one or more magnitudes of the one or more second portions of the audio signal ADS are greater than the predetermined threshold.

In operation S4, the one or more processing components 110 perform a noise reduction to the one or more deformed second portions of the audio signal ADS to reduce or remove the one or more deformed second portions of the audio signal ADS, so as to generate an output audio signal OPS. Details in this regard can be ascertained with reference to the paragraphs above, and a description in this regard will not be repeated herein.

After the output audio signal OPS is generated, the one or more processing components 110 output the output audio signal OPS, so that a speaker may give an audio output corresponding to the output audio signal OPS.

Through the operations described above, portions of the audio signal ADS corresponding to the user's voice can be reduced. In such a configuration, when the user wears a headset device, the user can hear the magnified attendee's voice received by the audio component 130 (e.g., microphone) without hearing his/her own voice received by the audio component 130, so that discomfort causing by hearing one's own voice from the headset device can be avoided.

Although the present invention has been described in considerable detail with reference to certain embodiments thereof, other embodiments are possible. Therefore, the scope of the appended claims should not be limited to the description of the embodiments contained herein.

What is claimed is:

1. An audio signal processing method, comprising:
   acquiring an audio signal;
   magnifying one or more first portions of the audio signal in response to one or more magnitudes of the one or more first portions of the audio signal are lower than a predetermined threshold;
   performing a modulo operation to one or more second portions of the audio signal in response to one or more magnitudes of the one or more second portions of the audio signal are greater than the predetermined threshold; and
   performing a noise reduction to the one or more second portions of the audio signal obtained by performing the modulo operation to reduce the one or more second portions of the audio signal obtained by performing the modulo operation.

2. The audio signal processing method as claimed in claim 1, wherein the operation of performing the modulo operation to the one or more second portions of the audio signal further comprises:
   magnifying the one or more second portions of the audio signal; and
   performing the modulo operation to the one or more magnified second portions of the audio signal.

3. The audio signal processing method as claimed in claim 2, wherein a gain of magnifying the one or more second portions of the audio signal is identical to a gain of magnifying the one or more first portions of the audio signal.

4. The audio signal processing method as claimed in claim 2, wherein a divisor of the modulo operation is equal to a product of the predetermined threshold and a gain of magnifying the one or more second portions of the audio signal.

5. The audio signal processing method as claimed in claim 1, wherein the operations of magnifying the one or more first portions of the audio signal and performing the modulo operation to the one or more second portions of the audio signal are performed by using identical mathematical function.

6. The audio signal processing method as claimed in claim 1 further comprising:
   performing an auto gain control to the audio signal to normalize the audio signal.

7. An audio signal processing electronic device, comprising:
   one or more processing components;
   a memory electrically connected to the one or more processing components; and
   one or more programs, wherein the one or more programs are stored in the memory and configured to be executed by the one or more processing components, the one or more programs comprising instructions for:
   acquiring an audio signal;
   magnifying one or more first portions of the audio signal in response to one or more magnitudes of the one or more first portions of the audio signal are lower than a predetermined threshold;
   performing a modulo operation to one or more second portions of the audio signal in response to one or more magnitudes of the one or more second portions of the audio signal are greater than the predetermined threshold; and
   performing a noise reduction to the one or more second portions of the audio signal obtained by performing the modulo operation to reduce the one or more second portions of the audio signal obtained by performing the modulo operation.

8. The audio signal processing electronic device as claimed in claim 7, wherein the one or more programs further comprises instructions for:

magnifying the one or more second portions of the audio signal; and performing the modulo operation to the one or more magnified second portions of the audio signal.

9. The audio signal processing electronic device as claimed in claim 8, wherein a gain of magnifying the one or more second portions of the audio signal is identical to a gain of magnifying the one or more first portions of the audio signal.

10. The audio signal processing electronic device as claimed in claim 8, wherein a divisor of the modulo operation is equal to a product of the predetermined threshold and a gain of magnifying the one or more second portions of the audio signal.

11. The audio signal processing electronic device as claimed in claim 7, wherein the operations of magnifying the one or more first portions of the audio signal and performing the modulo operation to the one or more second portions of the audio signal are performed by using identical mathematical function.

12. The audio signal processing electronic device as claimed in claim 7, wherein the one or more programs further comprises instructions for:

performing an auto gain control to the audio signal to normalize the audio signal.

13. A non-transitory computer readable storage medium storing one or more programs comprising instructions, which when executed, causes one or more processing components to perform operations comprising:

acquiring an audio signal;

magnifying one or more first portions of the audio signal in response to one or more magnitudes of the one or more first portions of the audio signal are lower than a predetermined threshold;

performing a modulo operation to one or more second portions of the audio signal in response to one or more magnitudes of the one or more second portions of the audio signal are greater than the predetermined threshold; and performing a noise reduction to the one or more second portions of the audio signal obtained by performing the modulo operation to reduce the one or more second portions of the audio signal obtained by performing the modulo operation.

14. The non-transitory computer readable storage medium as claimed in claim 13 comprising instructions, which when executed, causes one or more processing components to further perform operations comprising:

magnifying the one or more second portions of the audio signal; and performing the modulo operation to the one or more magnified second portions of the audio signal.

15. The non-transitory computer readable storage medium as claimed in claim 14, wherein a gain of magnifying the one or more second portions of the audio signal is identical to a gain of magnifying the one or more first portions of the audio signal.

16. The non-transitory computer readable storage medium as claimed in claim 14, wherein a divisor of the modulo operation is equal to a product of the predetermined threshold and a gain of magnifying the one or more second portions of the audio signal.

17. The non-transitory computer readable storage medium as claimed in claim 13, wherein the operations of magnifying the one or more first portions of the audio signal and performing the modulo operation to the one or more second portions of the audio signal are performed by using identical mathematical function.

* * * * *